United States Patent [19]

Suzuki

[11] Patent Number: 5,010,415
[45] Date of Patent: Apr. 23, 1991

[54] IMAGE FORMING APPARATUS HAVING SWITCHABLE COLOR SEPARATION FILTER UNITS

[75] Inventor: Makoto Suzuki, Nagoya, Japan

[73] Assignee: Brother Kogyo Kabushiki Kaisha, Japan

[21] Appl. No.: 570,545

[22] Filed: Aug. 21, 1990

[30] Foreign Application Priority Data

Aug. 24, 1989 [JP] Japan .................. 1-217822

[51] Int. Cl.$^5$ ............ G03F 3/06; H04N 1/29; G01D 15/14
[52] U.S. Cl. ................... 358/302; 358/300; 358/75; 346/107 R; 346/160; 355/32; 355/84; 355/88
[58] Field of Search ............... 358/300, 302, 75, 76; 346/107 R, 108, 110 R, 153.1, 160, 160.1, 157; 355/202, 326, 327, 32, 40, 74, 84, 88

[56] References Cited

U.S. PATENT DOCUMENTS

| | | | |
|---|---|---|---|
| 3,679,301 | 7/1972 | Inoue | 355/326 |
| 3,947,114 | 3/1976 | Washio | 355/326 |
| 4,685,000 | 8/1987 | Barrett | 358/76 |
| 4,810,614 | 3/1989 | Sangyoji et al. | |
| 4,875,074 | 10/1989 | Sangyoji et al. | |
| 4,884,082 | 11/1989 | Sonoda et al. | |
| 4,949,185 | 8/1990 | Nakai | 346/107 R |
| 4,967,227 | 10/1990 | Suzuki | 355/32 |

*Primary Examiner*—Benjamin R. Fuller
*Assistant Examiner*—Scott A. Rogers
*Attorney, Agent, or Firm*—Oliff & Berridge

[57] ABSTRACT

An image forming apparatus for forming a mask member on the basis of a color image information and exposing a photosensitive recording medium to light through the mask member to thereby forming a color image, including a light source for emitting light, at least two color separation filter units for passing the light therethrough and providing transmitted lights having different (broader and narrower) half-widths in spectrum to thereby irradiate the light having a desired half-width in spectrum to the photosensitive recording medium, a position detecting unit for detecting each position of said color separation filter units, and a switching unit for performing a switching operation between the color separation filter units to position desired one of said color separation filter units in an optical path of the light.

6 Claims, 3 Drawing Sheets

IMAGE FORMING APPARATUS HAVING SWITCHABLE COLOR SEPARATION FILTER UNITS

BACKGROUND OF THE INVENTION

This invention relates to an image forming apparatus for forming a color image on a photosensitive recording medium, and more particularly to an image forming apparatus having at least two color separation filters which provide different half-widths in wavelengths (spectrum) of lights transmitted therethrough.

There has been conventionally utilized an image forming apparatus in which mask members or intermediate sheets for forming three primary color images such as red, green and blue images are beforehand produced by a monochromatic printer and then a photosensitive recording medium is exposed to light through the mask members or intermediate sheets to thereby forming a color latent image on the photosensitive recording medium. This image forming apparatus further includes a color separation filter unit comprising a set of red, green and blue color separation filters which are used to separate red, green and blue lights from a white light, and a filter switching or selecting unit for switching one of the color separation filters to another according to the type (red, green or blue) of a mask member to be exposed to light.

In an exposure process, a white light which has been color-separated by a color separation filter is irradiated through the corresponding mask member to the photosensitive recording medium (hereinafter referred to as "photosensitive sheet") to form one of the red, green and blue color latent images. This exposing operation is repeated for forming the other color latent images, and a color image corresponding to an original image is finally formed on the photosensitive sheet.

In the conventional image forming apparatus thus constructed, two types of color separation filter units as described below are used to shorten an exposure time for which the photosensitive recording medium is exposed through the mask members, and to improve an image quality of a finally-obtained color image, respectively.

In order to shorten the exposure time, each of the color separation filters of the color separation filter unit is so designed that a half-width in wavelength (spectrum) of light transmitted therethrough is broader and thus a light-amount of the transmitted light is larger. However, in this type of color separation filters, a crosstalk is liable to occur between the neighboring different kinds of microcapsules having sensitivities to different wavelength ranges because each color separation filter provides a transmitted light having a broader half-width in spectrum.

On the other hand, in order to improve the image quality of an output color image, each of the color separation filters is so designed that the half-width in wavelength (spectrum) of the transmitted light is narrower. However, in this type of color separation filters, the exposure time must be more increased because the half-width in spectrum of the transmitted light is narrower and thus the light-amount of the light is smaller.

In the conventional image forming apparatus as described above, however, only one of the color separation filter units as described above can be individually used in the image forming apparatus in order to attain either of the above objects. That is, both of the color separation filter units as described above can not be used in combination mode or in switching mode in the conventional apparatus to attain both of the above objects. In addition, an user can not freely select one of the color separation filters as described above, that is, the right of choice is not provided to the user.

SUMMARY OF THE INVENTION

An object of this invention is to provide an image forming apparatus having at least two color separation filter units each comprising a set of primary color filters in which one of color separation filter units can be freely switched to another in accordance with operational conditions for shortening the exposure time, improving the image quality and so on, to thereby freely select the color separation filter unit most suitable for the current operational condition.

In order to attain the above object, an image forming apparatus according to this invention in which a mask member is formed on the basis of a color image information and a photosensitive recording medium is exposed to light through the mask member to thereby forming a color image, includes a light source for emitting light, at least two color separation filter units for passing the light therethrough and providing transmitted lights having different half-widths in spectrum to thereby irradiate the light having a desired half-width in spectrum to the photosensitive recording medium, a position detecting unit for detecting each position of the color separation filter units, and a switching unit for performing a switching operation between the color separation filter units to position desired one of the color separation filter units in an optical path of the light.

Preferably, one of the color separation filter unit has a capability of providing a transmitted light having a broader half-width in wavelength (spectrum), and the other has a capability of providing a transmitted light having a narrower half-width in wavelength (spectrum).

According to the image forming apparatus thus constructed, in response to a selection signal indicating (selecting) one of the color separation filter units (that is, representing a selection mode), the position detection unit determines the current position of the selected color separation filter unit, and the switching unit switches one of the color separation filter units to the selected one.

DETAILED DESCRIPTION OF THE INVENTION

A preferred embodiment of this invention will be described hereunder with reference to the accompanying drawings.

Figure 1:
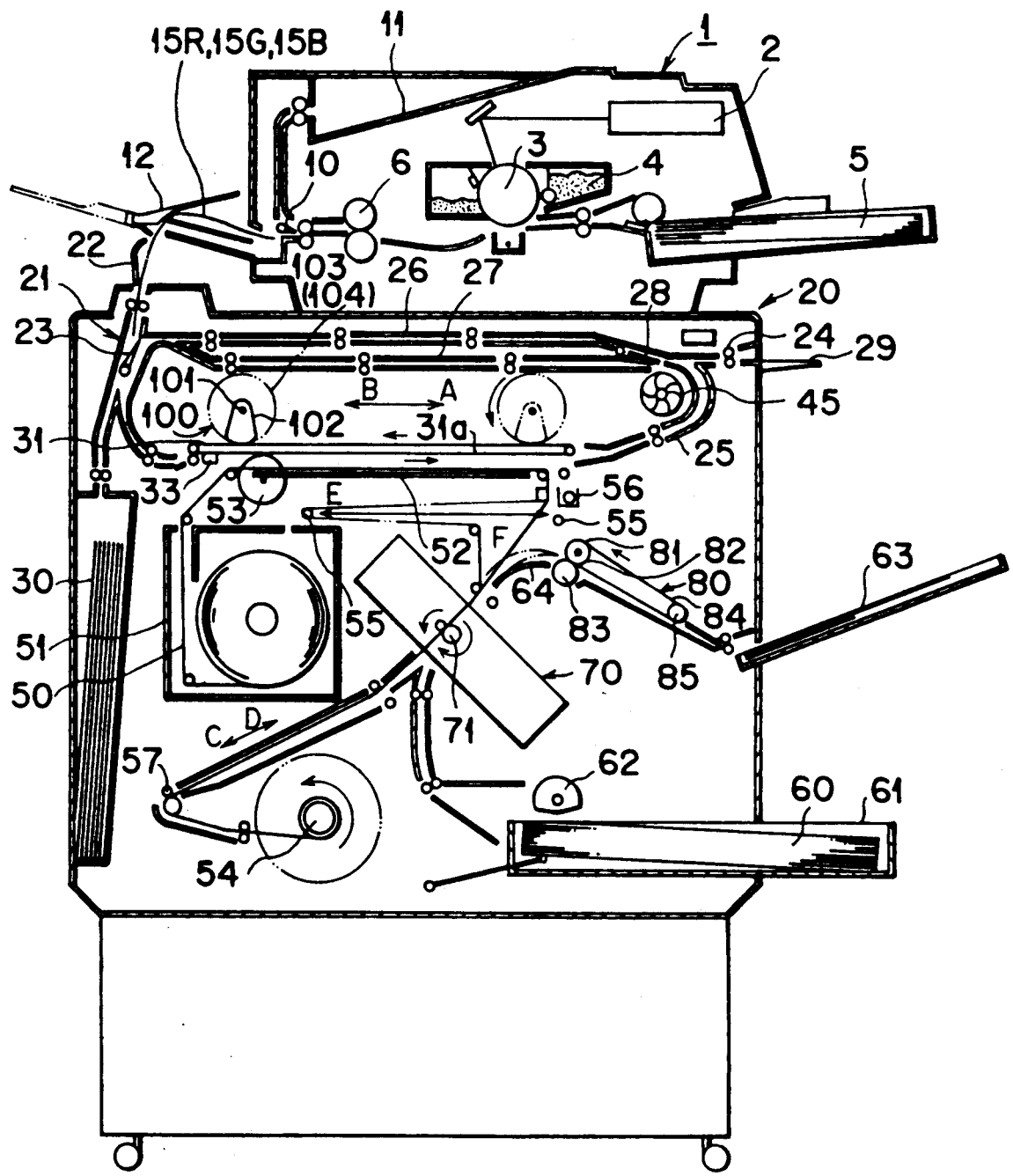
FIG. 1 shows an image forming apparatus according to this invention.

FIG. 1 shows an image forming apparatus according to this invention.

The image forming apparatus according to this invention comprises a monochromatic laser printer 1 for producing mask members for forming red, green and blue color images and a color image forming apparatus 20 for forming a color image corresponding to an original using the mask members, which are used in combination.

The monochromatic laser printer 1 is disposed on an upper portion of the color image forming apparatus 20, and includes therein a polygon scanner 2 for irradiating a laser beam on the charged surface of a photosensitive drum 3 in accordance with a color image information inputted by a host computer to form each of electrostatic latent images for red, green and blue color images, a developer unit 4 for developing each of the electrostatic latent images formed on the drum 3, a sheet cassette 5 for accommodating a stack of sheets such as plain paper or OHP sheets, the developer latent image on the drum 3 being transferred to a sheet supplied from the sheet cassette 5, and a fixing unit 6 for fixing the transferred image on the sheet and forming a toner image on the sheet.

The sheet on which the toner image has been formed in the monochromatic laser printer 1 is discharged through a sheet path switching unit 10 to a discharge tray 11 or 12 if a monochromatic (black-and-white) image is required, or discharged to the color image forming apparatus 20 through the discharge tray 12 if a color image is required.

The discharge tray 12 is provided at the side of the monochromatic laser printer 1 in such a manner that the free end portion thereof is swingable between the positions indicated by solid and dotted lines as shown in FIG. 1. When the discharge tray 12 is at the position indicated by the solid line, three sheets on which toner images for three primary color images are successively formed respectively, are sequentially fed in a set through the discharge tray 12 into the color image forming apparatus 20 and are used as mask members 15 (15R, 15G and 15B) for forming a color image in the color image forming apparatus 20.

The construction of the color image forming apparatus 20 will be described hereunder.

At an upper portion of the color image forming apparatus 20 is provided a mask member feeding unit 21 comprising a positioning unit 31, a circulating guide member 25 and two accommodating trays 26 and 27 disposed in parallel, those elements being annularly interconnected to one another. Each of the positioning unit 31 and the accommodating trays 26 and 27 is interconnected through a guide member 22 to the discharge tray 12 of the monochromatic laser printer 1 and the sheet (mask member) outputted from the monochromatic laser printer 1 is discharged through the guide member 22 to the positioning unit 31.

Further, a gate member 23 is provided under the guide member 22 in the color image forming apparatus 20, and the mask member 15 fed along the guide member 22 is lead to either of the positioning unit 31 or a sheet discharge tray 30 by the gate member 23. Still further, another gate member 28 is provided between the circulating guide member 25 and each of the accommodating trays 26 and 27. The mask member 15 fed along the circulating guide member 25 is lead to either of the upper accommodating tray 26 or the lower accommodating tray 27 by a switching operation of the gate member 28.

In the image forming apparatus of this invention, it is not necessary that the mask members are supplied to the color image forming apparatus 20 directly from the monochromatic laser printer 1. For example, the mask members are beforehand formed by a well-known apparatus such as a monochromatic printer or the like, and thereafter they may be supplied to the color image forming apparatus 20 through a manual insertion tray 29 as shown in FIG. 1. In this case, the mask member 15 which is manually inserted through the manual insertion tray 29 is supplied through the gate member 28 to the mask member feeding unit 21.

The positioning unit 31 comprises an endless belt 31a formed of light-transmissible dielectric material (for example, polyethylene terephthalate: PET) which is suspended between two rotatable shafts. At least one of the two rotatable shafts is rotated by a motor (not shown), and thus the endless belt 31a is circulatingly driven in accordance with the rotation of the shaft in a direction as indicated by an arrow of FIG. 1. The surface of the belt 31a is charged by a charger such as a corotron (not shown), so that the mask member 15 is electrostatically attracted to the surface of the belt 31a with an electrical attractive force. Further, there is provided in the neighborhood of the belt 31a a sensor bar 33 having thereon a positioning sensor for locating a mask member at a predetermined position and a discriminating sensor for discriminating the type of the mask member (that is, the red, green or blue mask member). These sensors detect positioning and discriminating marks printed at a predetermined portion on the mask member 15 to thereby locate the mask member at a predetermined position and judges the type of the mask member (that is, a mask member used for red, green or blue image light).

Figure 2:
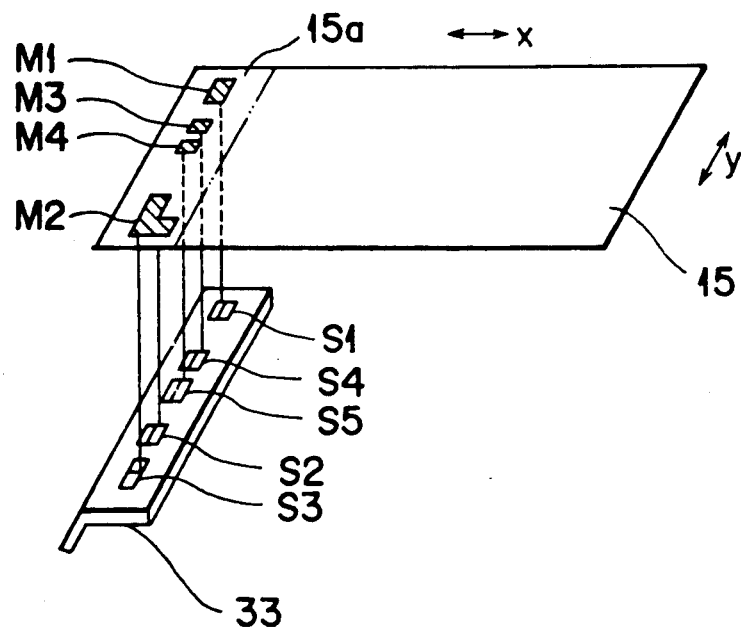
FIG. 2 shows a mask member on which positioning and color discriminating marks are printed.

FIG. 2 shows a positional relationship between the sensor bar 33 and the marks printed on the mask member 15.

As shown in FIG. 2, at a non-image forming portion 15a on the mask member 15 are provided (printed) a mark M1 used for detecting a position of the mask member 15 in the X-direction as shown in FIG. 2, a mark M2 used for detecting positions of the mask member 15 in the X- and Y-directions, and marks M3 and M4 used for discriminating the type of the mask member 15 (that is, the red, green or blue mask memtbe). On the other hand, sensors S1 and S2 for detecting a position of the mask member 15 in the X-direction, an S3 for detecting a position of the mask member 15 in the Y-direction and discriminating sensors S4 and S5 are provided on the sensor bar 33 in such a manner as to be located at the substantially corresponding positions to these marks on the mask member 15. Each of the sensors is of a light-reflection type, and comprises a light-emitting diode (LED) and a photodiode. These sensors detect the presence of the marks by detecting a change in reflectivity between the marks and the surface of the mask member 15.

An exposure device 100 is disposed above the positioning unit 31 in such a manner as to be forwardly and rearwardly (right and left in FIG. 1) movable along the positioning unit 31. The exposure device 100 includes a rod type of white light source 101 (hereinafter referred to as "lamp") for emitting a white light, a reflection plate 102 for reflecting the white light emitted from the lamp 101, which has an U-shaped cross section and surrounds the lamp 101, and first and second color separation filter unit 103 and 104 for passing specific color lights therethrough, which are disposed on the same periphery above the positioning unit 31 in such a manner as to surround the lamp 101 and the reflection plate 102. The lamp 101 and the reflection plate 102 extend in a direction substantially perpendicular to a feeding direction of the mask member 15 in the positioning unit 31. The first color separation filter 103 comprises a first red filter 103R for passing a red light therethrough, a first green filter 103B for passing a green light therethrough and a first blue filter 103G for passing a blue light therethrough, while the second color separation filter unit 104 also comprises second red, green and blue filters 104R, 104G and 104B.

Figure 3:
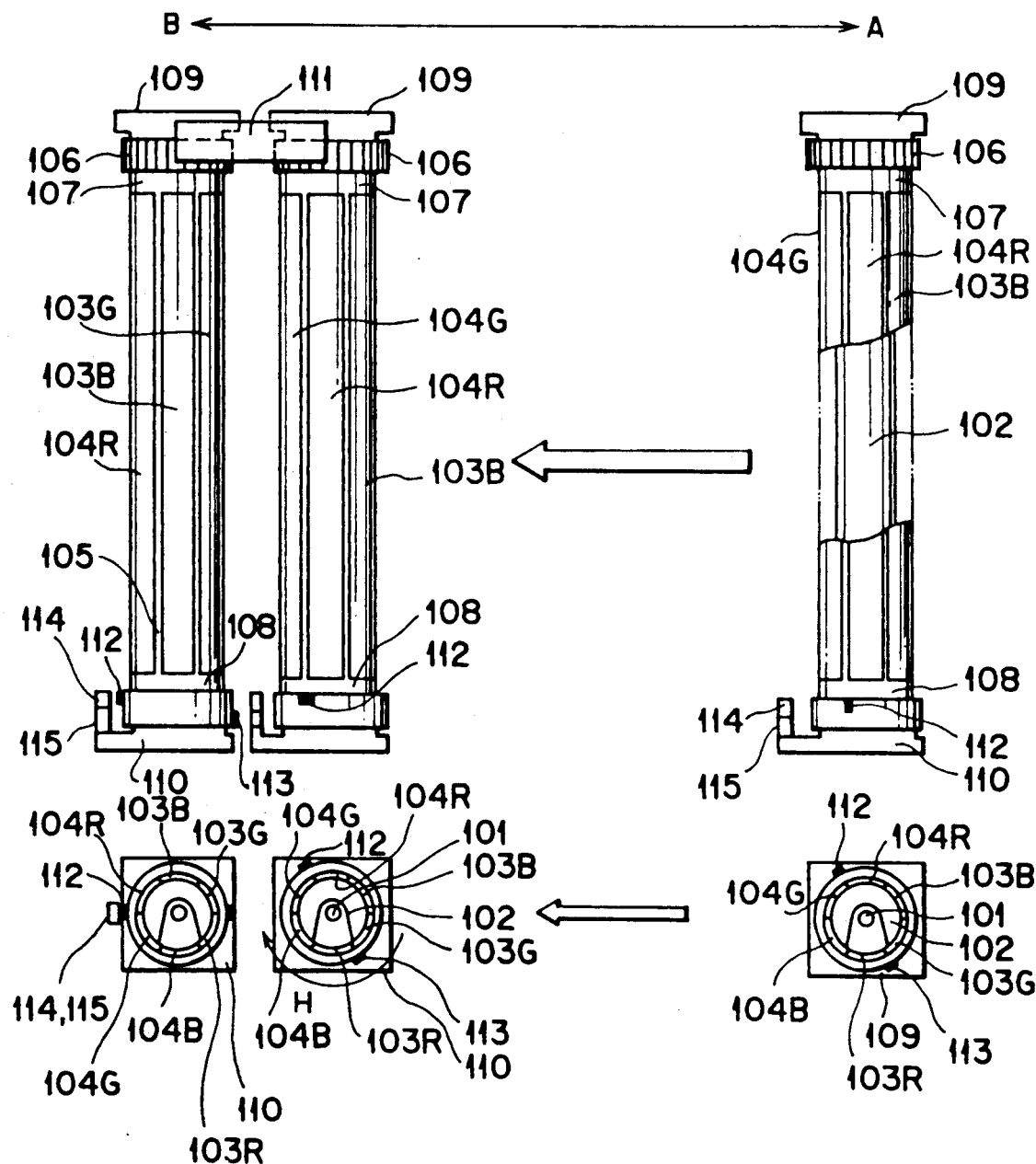
FIG. 3 is a schematic view for showing an operation of the exposure unit.

A detailed construction of the exposure device 100 and a switching (selecting) operation between the color separation filter units 103 and 104 will be described hereunder with reference to FIG. 3.

The exposure device 100 comprises the rod type lamp 101, the reflection plate 102, a cylindrical frame 105 accommodating the lamp 101 and the reflection plate 102 therein and having plural openings which are independently provided on the peripheral surface thereof in such a manner as to section the peripheral surface into six parts, the first and second filters of the first and second color separation filter units 103 and 104 being provided to the openings, cylindrical support members 107 and 108 which support both ends of the cylindrical frame 105 and are ratable integrally with the cylindrical frame 105, at least one of the support members having a toothed wheel 106 at the peripheral surface of one end thereof, and frames 109 and 110 for supporting the support members 107 and 108 respectively in such a manner that the support members 107 and 108 are rotatable. The frames 109 and 110 are connected with each other by a tie plate (not shown), so that the above elements are united into a packed exposure device 100.

The exposure device thus packed is reciprocatingly moved in the directions as indicated by arrows A and B (that is, in a mask feeding direction) by a driving source (not shown) to thereby expose a desired portion on a photosensitive recording medium to light.

The support member 107 includes an one-way clutch (not shown), and is rotated in a direction as indicated by an arrow H only when the toothed wheel 106 of the support member 107 is engaged with a fixed rack 111 and the exposure device 100 is moved in the direction B, thereby performing a switching operation between the color separation filter unit 103 and 104 provided on the cylindrical frame 105.

The support member 108 is provided with origin-detection marks 112 and 113 for indicating the origins of the first and second color separation filter units 103 and 104, respectively, and filter original detection sensors 114 and 115 for detecting the origin-detection marks 112 and 113, respectively, are fixedly provided so as to confront these marks 112 and 113. By memorizing the number of the switching operations which are carried out until the filter-origin is detected, the type of the current filter (that is, red, green or blue color filter) which is currently located in an optical path of the light emitted from the lamp 101 is constantly monitored.

The photosensitive recording medium 50 is mainly formed of a photosetting resin and photopolymerization initiator as disclosed in Japanese Unexamined Published Patent Application No. 62-143044. In detail, the photosetting recording medium 50 comprises a substrate sheet coated with microcapsules encapsulating at least both of photosetting resins curable by lights having wavelengths of red, green and blue, respectively, and dye precursors of cyan, magenta and yellow. The photosensitive recording medium 50 is accommodated in a cartridge 51 while prevented from being exposed to light.

Figure 4:
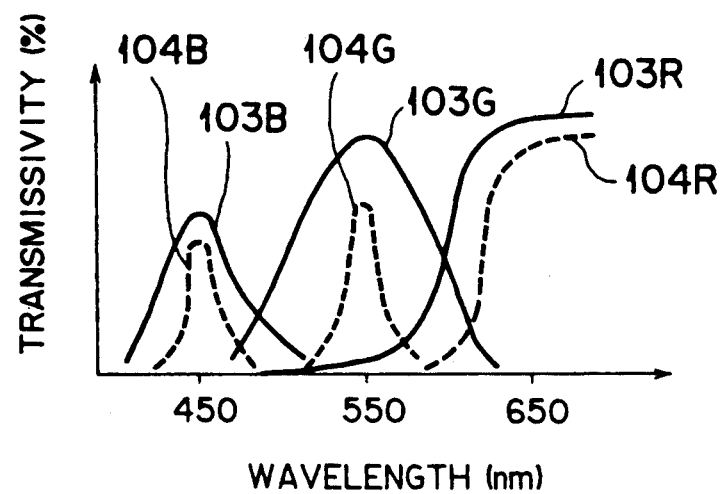
FIG. 4 is a graph showing spectra of lights transmitted through color separation filter units.

FIG. 4 is a graph showing spectra of lights transmitted through the color separation filters 103R, 103G, 103B, 104R, 104G and 104B, respectively. As shown in FIG. 4, the first and second color separation filter units 103 and 104 provide transmitted lights having different half-widths in wavelenth (spectrum). That is, the first color separation filter unit 103 (filters 103R, 103G and 103B) provides a transmitted light having a broader half-width in spectrum than the second color separation filter unit 104 (filters 104R, 104G and 104B). Accordingly, according to the switching mechanism of the two color separation filter units as described above, two types of red, green and blue color transmitted lights can be produced.

The photosensitive recording medium 50 which is drawn out of the cartridge 51 is passed through a gap between the belt 31a and an exposure stand 52 to be exposed through the mask member 15 to light, and then is fed through a fixing roller 56, a slack eliminating unit 55, a movable guide 64, a pressure developing unit 70 and a driving roller 57 to a take-up roller 54 for winding up the photosensitive recording medium.

The exposure stand 52 is upwardly moved by a cam 53 in an exposure operation of the exposure device 100 to keep the photosensitive recording medium 50 in close contact with the mask member 15 fed to the exposure stand 52 by the belt 31a. A photosensitive recording medium 50, after exposed to light, is immobilized by the fixing unit 56 and is prevented from slackening by the slack eliminating unit 55 during a pressure-developing process therefor. Further, the photosensitive recording medium 50 is fed at a constant speed by the driving roller 57.

On the other hand, the developer sheet 60 comprises a base sheet coated with developer agent as disclosed in Japanese Unexamined Published Patent Application No. 58-88739, and is accommodated in a cassette 61 with a developer agent-coated surface thereof placed face down. The developer sheet 60 is picked up from the cassette 61 one by one using a sheet supply unit such as a sector roller 62, which is intermittently driven by a driving source (not shown), and then is fed to the pressure-developing unit 70. The developer sheet is supplied with pressure by the pair of pressure rollers 71 of the pressure-developing unit 70 while superposed over the photosensitive recording medium 50 which has been exposed to light to form a latent image, thereby develop the latent image on the photosensitive recording medium 50 into a visible image on the developer sheet.

The heat fixing unit 80 comprises a heat roller 82 including a heater 81 therein, an auxiliary roller 85, an endless belt 84 suspended between the heat roller 82 and the auxiliary roller 85 and a press roller 83 which is designed to be contacted with the heat roller 82 through the endless belt 84 under pressure. The developer sheet 60 is fed along a movable guide 64 from the pressure-developing unit 70 to be calendered by the heat fixing unit 80, and discharged to the discharge tray 63.

An image forming process of the image forming apparatus according to this invention will be described hereunder.

A mask member 15R for a red color image is first formed by the monochromatic laser printer 1. The mask member 15R has a toner-coated area which is coated with toner, and a toner-uncoated area which is coated with no toner. The toner-coated area of the mask member 15R constitutes a toner image (light-shielding image) which prevents light from being passed therethrough, while the toner-uncoated area of the mask member 15R passes the light therethrough to photocure those microcapsules on the photosensitive recording medium 50 which encapsule cyan dye precursors therein.

In a mask member forming process, the discharge tray 12 of the monochromatic laser printer 1 is disposed at the position as indicated by a solid line, and the mask member 15R thus formed is fed along the guide member 22 to the mask member feeding unit 21 of the color image forming apparatus 20. In this case, if the sensors of the positioning unit 31 detect no other mask member therein, the mask member 15R is fed through the gate member 23 to the positioning unit 31.

The mask member 15R which is supplied to the positioning unit 31 is electrostatically attached to the belt 31a and fed to a predetermined exposure position. Thereafter, the whole body of the positioning unit 31 is moved in the X- and Y-directions as shown in FIG. 2 by a driving source (not shown) on the basis of detection signals for the marks M1 and M2 printed on the mask member 15R which are outputted from the sensors S1, S2 and S3 on the sensor bar 33, thereby accurately positioning the mask member 15R in the positioning unit 31.

One of the first and second color separation filter units 103 and 104 is beforehand selected through a mode selecting operation by a panel switch or an interface. For example, when the first color separation filter unit 103 is selected, the first color separation filter unit 103 is positioned at the origin thereof by reciprocatingly moving the exposure unit 100 and rotating the toothed wheel 106 through the engagement between the toothed wheel 106 and the rack 111 until the origin-detection mark 112 for the first color separation filter unit 103 is detected by the origin-detecting sensor 114 in a resetting operation of the color image forming apparatus 20. After or before the positioning operation of the positioning unit 31, the presence of the discriminating marks M3 and M4 on the mask member 15 are detected by the sensors S4 and S5 on the sensor bar 33, and the type of the mask member 15 is determined on the detection result by a controller (not shown).

If the first red filter 103R of the filter unit 103 of the exposure unit 101 does not confront the mask member 15R, the filter unit 103 is switched (rotated) through engagement between the toothed wheel 106 and the rack 111 by reciprocatingly moving the exposure unit 100 until the suitable color filter 103R is positioned in the optical path and beneath the lamp 101.

When the second color separation filter unit 104 is selected, the origin-detection mark 113 is similarly detected by the origin-detecting sensor 115, and the second color separation filter 104 is position at the origin thereof.

Next, the photosensitive recording medium 50 is immobilized by the fixing unit 56, and the cam 53 is rotated by a predetermined angle by a driving source (not shown) to upwardly lift the exposure stand 52, whereby the photosensitive recording medium 50 is in close contact with the belt 31a through the mask member 15R.

When the exposure stand 52 comes in contact with the positioning unit 31, the lamp 101 lights, and a red light which is obtained through the red filter 103R is irradiated to the photosensitive recording medium 50 through the mask member 15R, while the exposure unit 100 is moved in the direction as indicated by the arrow A, so that a scanning operation for the photosensitive recording medium 50 is performed with the red light. After the exposure operation is completed, the lamp 101 is turned off and the exposure unit 100 is returned in the direction as indicated by the arrow B. In this case, as described above, the filter 103 and the toothed wheel 106 of the support member 107 are engaged with the rack 111 during the returning movement of the exposure unit 100, whereby the frame 105 and the support members 107 and 108 are rotated in a direction as indicated by an arrow H, so that the green filter 103G is positioned in the optical path beneath the lamp 101. During the retuning movement of the exposure unit 100, the exposure stand 52 is descended by rotation of the cam 53, so that the photosensitive recording medium 50 is moved away from the positioning unit 31 and the mask member 15R.

The photosensitive recording medium 50 in the cartridge 51 is supplied with a back tension force at a rotational center of the roll, and therefore the photosensitive recording medium 50 is drawn out of the cartridge 51 by a length corresponding to an ascendant amount of the exposure stand 52 when the exposure stand 52 is ascended. Further, when the exposure process is finished and the exposure stand 52 is descended, the photosensitive recording medium 50 is wound up in the cartridge 51 in a direction where the slack of the photosensitive recording medium 50 is eliminated.

When the exposure operation is finished for the red mask member 15R and the descending operation of the exposure stand 52 is confirmed, the belt 31a of the positioning unit 31 is rotated and the mask member 15R is fed through the circulating guide member 25 and then guided through the gate 28 to the accommodating tray 26.

Next, the green mask member 15G which has been formed in the monochromatic laser printer 1 is fed through the guide member 22 and then is guided through the gate member 23 to the positioning unit 31. Similarly in the exposure operation for the red mask member 15R, after the positioning operation of the photosensitive recording medium 50, the exposure stand 52 is ascended so that the photosensitive recording medium 50 and the mask member 15G come in close contact with the belt 31a of the positioning unit 31. Thereafter, the lamp 102 lights and a green light is irradiated through the green filter 103G to the photosensitive recording medium 50. After the exposure process is finished, the exposure stand 52 is descended, and the mask member 15G is upwardly fed along the circulating guide member 25 to the accommodating tray 27 by the rotation of the gate member 28. Thereafter, the exposure stand 100 is returned to the initial position and the filter unit 103 is rotated, so that the blue filter 103B is positioned just beneath the lamp 101.

By the same operation as described above, the blue mask member 15B which has been formed in the monochromatic laser printer 1 is fed through the mask member feeding unit 21 to the positioning unit 31, and is disposed at a predetermined position by the positioning unit 31. Thereafter, the photosensitive recording medium 50 is exposed to a blue light by the exposure unit 100.

A color latent image is finally formed on the photosensitive recording medium 50 after a series of the processes as described above are completed. At a next stage, the exposure stand 52 is descended, the fixing unit 56 is moved away from the photosensitive recording medium 50 and the driving roller 57 is rotated, so that the photosensitive recording medium 50 is wound up in a direction as indicated by an arrow C of FIG. 1. In this case, in order to eliminate the slack of the photosensitive recording medium 50, the buffer 55 and the movable guide member 64 are located at a position as indicated by the solid line. In addition, the pressure rollers 71 of the pressure-developing unit 70 are away from each other, so that the microcapsules on the photosensitive recording medium 50 suffer no damage such as scratch or rupture during a winding operation of the photosensitive recording medium 50. The rotation of the driving roller 57 is stopped at the instant time when the trailing end portion of the latent image on the photosensitive recording medium 50 comes to a gap between the pressure rollers 71 of the pressure developing unit 70.

In synchronism with the movement of the photosensitive recording medium 50, the developer sheet 60 is supplied from the cassette 61 by the sheet supply roller 62, and is disposed at a position where the leading end of the developer sheet confronts the trailing end of the photosensitive recording medium 50. The pressure rollers 71 are contacted with each other while rotated in a direction as indicated by an arrow by a driving source (not shown), and the photosensitive recording medium 50 is immobilized by the fixing roller 56 again. Thereafter, the photosensitive recording medium 50 is fed in a direction as indicated by an arrow D while superposed over the developer sheet 60 under pressure, whereby the unexposed microcapsules on the photosensitive recording medium 50 are ruptured by the pressure supplied from the pressure rollers 71 to thereby form a color image corresponding to the color latent image on the developer sheet 60.

As the pressure rollers 71 of the pressure-developing unit 70 are rotated in the direction as indicated by the arrow, the slack eliminating unit 55 is moved in the direction as indicated by the arrow E, so that the slack of the photosensitive recording medium 50 is eliminated. During the movement of the slack eliminating unit 55 in the direction (E), the movable guide member 64 is moved to and disposed at a position as indicated by the dotted line using a mechanism (not shown) to thereby exfoliate the leading end of the developer sheet 60 from the photosensitive recording medium 50, and guide the developer sheet 60 to the heat fixing unit 80.

In the heat fixing unit 80, the developer sheet 60 is supplied with heat through the heat roller 82 and the endless belt 84 to thereby promote coloring of the color image on the developer sheet 60. In addition, a binder polymer which is used to fix the developer agent on the base sheet of the developer sheet 60 is thermally fused in the heat fixing unit 80, whereby the developer sheet 60 is provided with smoothness corresponding to that of the endless belt 84 and suitable luster.

The developer sheet 60, after coloring and calendering processes in the heat fixing unit 80, is bifurcately separated from the endless belt 84 and discharged to the discharge tray 63.

Since the photosensitive recording medium 50 is immobilized by the fixing unit 56 during a series of the developing, coloring and calendering processes, the photosensitive recording medium 50 does not suffer a change in tension in the exposure process due to the developing process. Therefore, a next exposure process for forming a next latent image on the photosensitive recording medium can be carried out on the exposure stand 52 even during the developing process for the previous latent image in the pressure-developing process.

When plural color images are required using the same mask member 15, the mask member 15R accommodated in the accommodating tray 26 is again fed through the gate 23 to the positioning unit 31 by the mask member feeding unit 21, and the same process as carried out for obtaining a first color image is repeated to obtain a second color image. Similarly, the other mask members 15G and 15B are successively fed to the positioning unit 31 through the accommodating trays 26 and 27 after the mask member 15R is exposed to light. As described above, the mask members are repeatedly circulated desired times through the mask member feeding unit 21. After the desired number of the color images are obtained from the same set of mask members 15(15R, 15G and 15B), the gate member 23 is rotated to discharge each of the mask members 15 in the mask member feeding unit 21 to the discharge tray 30.

Further, if a next set of mask members are supplied from the monochromatic laser printer 1 to the color image forming apparatus during a series of exposure processes for the previous mask members, the next set of mask members are once discharged to the discharge tray 30 through the gate member 23.

Still further, as described above, the mask member feeding unit 21 is provided with the sheet insertion tray 29 for manually inserting therein the mask members 15 which are formed by another means. In this case, a manual insertion gate member 24 is provided to prevent a manual insertion of the mask members 15 if another mask member has been already supplied to the mask member feeding unit 21.

Values of the half-widths of the color filters are determined on the basis of a sensitivity of the photosensitive recording medium. That is, the values of the halfwidths are different in accordance with the sensitivity of the photosensitive recording medium to be used. In general, the photosensitive recording medium is coated with yellow, magenta and cyan microcapsules for forming a visible image thereon. Each of the yellow, magenta and cyan microcapsules has an inherent spectral sensitivity, but cross-talk in spectrum exists between the yellow and magenta microcapsules and between the magenta and cyan microcapsules. The term "light having a broad half-width" as described above means a light having a wavelength range extending into the crosstalk area of the photosensitive recording medium, and the term "light having a narrow half-width" means a light having a wavelenth range which does not extend to the cross-talk area. Accordingly, if the filter providing a transmitted light having a broad half-width is used, a cross-talk occurs between the different color microcapsules having a crosstalk area in spectrum, but a large amount of light can be irradiated through the filter to the microcapsules. On the other hand, if the filter providing a transmitted light having a narrow half-width is used, no cross-talk occurs between the different color microcapsules, but a light amount of the transmitted light is small.

As described above, the value of the half-width of the filter is changed in accordance with the kind of the microcapsules used in the image forming apparatus, and thus is not limited to a specific value. As examples of the halfwidth ranges of the filters, as shown in FIG. 4 , there may be used 440-460 nm for the filter 104B, 540-560 nm for the filter 104g, above 620 nm for the filter 104R, 420-430 nm for the filter 103B, 500-600 nm for the filter 103G and above 600 nm for the filter 103R.

As described above, the image forming apparatus according to this invention is provided with at least two types of color separation filter units, one type of which has three color filters each providing a transmitted light having a narrower half-width wavelength (spectrum) and the other of which has three color filters each providing a transmitted light having a broader half-width in wavelength (spectrum), and the color separation filter units can be freely exchangeable (switchable) to each other according to purposes. Accordingly, if a color image having sharp color is required, the color separation filter unit for providing a transmitted light having a narrower half-width in spectrum is selected. On the other hand, if it is required to form a color image for a short time, the color separation filter unit for providing a transmitted light having a broader half-width in spectrum is selected. That is, according to the image forming apparatus of this invention, an user can freely select a color mode.

WHAT IS CLAIMED IS:

1. An image forming apparatus for forming a mask member on the basis of a color image information and exposing a photosensitive recording medium to light through the mask member to thereby forming a color image, including:

a light source for emitting light;

at least two color separation filter units for passing the light therethrough and providing transmitted lights having different half-widths in wavelength to thereby. irradiate the light having a desired half-width in wavelength to the photosensitive recording medium;

a position detecting unit for detecting each position of said color separation filter units; and a switching unit for performing a switching operation between said color separation filter units to position desired one of said color separation filter units in an optical path of the light.

2. An image forming apparatus as claimed in claim 1, wherein one of said color separation filter units provides a, transmitted light having a broader half-width in wavelength than the other color separation filter unit.

3. An image forming apparatus as claimed in claim 1, wherein each of said color separation filter units includes red, green and blue color filters.

4. An image forming apparatus as claimed in claim 3, wherein said switching unit compises a rotatable cylindrical frame having plural openings on the peripheral surface thereof and surrounding said light source for passing the light emitted from the light source through one of said openings, said openings being provided with said color filters in one-to-one correspondence, and a frame rotating unit for rotating said cylindrical frame by a desired angle to thereby pass the light through a desired color filter.

5. An image forming apparatus as claimed in claim 4, wherein said position detecting unit includes origin-detection marks for said color separation filter units, said marks being provided to one end of said cylindrical frame, and sensors for detecting said origin-detection marks to monitoring the current color filter in the optical path of the light, said sensors being disposed so as to confront said marks.

6. An image forming apparatus as claimed in claim 4, wherein said frame rotating unit comprises a toothed wheel provided to at least one end of said cylindrical frame and a fixed rack engageable with said toothed wheel, said cylindrical frame being rotated through engagement between said toothed wheel and said fixed rack.

* * * * *